US006331798B1

(12) United States Patent
O'Leary et al.

(10) Patent No.: US 6,331,798 B1
(45) Date of Patent: Dec. 18, 2001

(54) CONTROL ARRANGEMENT AND METHOD FOR HIGH-SPEED SOURCE-TRANSFER SWITCHING SYSTEM

(75) Inventors: Raymond P. O'Leary; Michael G. Ennis, both of Evanston; Joseph W. Ruta, Arlington Heights; Anthony F. Segredo, Streamwood, all of IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 09/556,261

(22) Filed: Apr. 24, 2000

Related U.S. Application Data
(60) Provisional application No. 60/131,856, filed on Apr. 29, 1999.

(51) Int. Cl.[7] .................................................. H03K 17/73
(52) U.S. Cl. .............................. 327/470; 307/87; 307/127
(58) Field of Search .................................... 307/127, 112, 307/18, 23, 29, 43, 64, 70, 80, 81, 85, 86, 87; 327/470, 472

(56) References Cited

U.S. PATENT DOCUMENTS 5,808,378 * 9/1998 O'Leary ................................. 307/87
6,023,193 * 2/2000 Ierymenko .......................... 330/255
6,137,191 * 10/2000 O'Leary et al. ..................... 307/125

* cited by examiner

Primary Examiner—Jung Ho Kim
(74) Attorney, Agent, or Firm—James V. Lapacek

(57) ABSTRACT

A control arrangement and method is provided for a power electronic system configured as a high-speed source-transfer switching systems (HSSTSS). The HSSTSS supplies an electrical load with alternating current from either a first source or a second source via respective first and second solid-state switches. The HSSTSS also includes a controller that samples the voltage waveforms of each of the first and second sources to detect when transfer between the sources is desirable, e.g. outages or voltage that is either too low or too high. The controller provides appropriate control signals to control operation of the solid-state switches and transfer supply of the load therebetween. The control arrangement avoids undesirable current flow between sources via a comparison of the voltages of the sources and current in the outgoing source, i.e. a polarity comparison to ensure that the current that will flow in the incoming source after transfer will be in opposition to the current flowing in the outgoing source before transfer. Thus, the transfer is delayed until the polarity comparison is satisfied. Additionally, the control arrangement minimizes undesirable transfer delays by establishing appropriate transfer conditions before issuing control signals to perform the transfer between sources, i.e. the transfer to turn on the incoming switch is delayed until after appropriate conditions establish that the outgoing source is off or can be effectively turned off. One form of appropriate conditions include the establishing of forced commutation conditions, preferably established by the incoming source voltage differential and the outgoing current being of the same polarity such that the voltage differential across the solid-state switch that is being turned on is sufficient to establish an initial change in current flow in opposition to the current flow in the solid-state switch to be turned off. The appropriate forced commutation is established by the voltage differential between the two sources being of sufficient magnitude to force the outgoing current to zero. Additionally, under certain conditions, the transfer is accomplished by awaiting the next current zero.

9 Claims, 5 Drawing Sheets

CONTROL ARRANGEMENT AND METHOD FOR HIGH-SPEED SOURCE-TRANSFER SWITCHING SYSTEM

This application claims the benefit of U.S. Provisional Application No. 60/131,856 filed on Apr. 29, 1999.

BACKGROUND OF THE INVENTION

1. Field of the Invention

The present invention relates generally to high-speed source-transfer switching systems and more particularly to a control arrangement and method that controls the transfer of a load from one source to another in a desirable fashion to minimize transfer delays while also avoiding undesirable current flow between the sources.

2. Description of Related Art

High-speed source-transfer switching systems (HSSTSS) for electrical power distribution systems provide reliable, continuous power delivery to a load by transferring the supply of the load from a first source to a second independent source when undesirable characteristics are sensed in the first source. To achieve high-speed transfer operation, one type of HSSTSS utilizes solid-state switches formed by thyristors, one solid-state switch for each of the sources. These high-speed switches are also known as static transfer switches. To control the transfer operations, the HSSTSS utilizes control arrangements to provide appropriate control signals to control the operation of the thyristors of each solid-state switch via the gate of each thyristor. The control arrangements sample the voltage waveforms of each source to detect when transfer between the sources is necessary, e.g. sensing outages and momentary interruptions as well as voltage sags and swells based on the source supplying the load being above or below preset levels. Under certain circuit conditions, transfer between sources by the control arrangements can introduce undesirable transfer delays and/or permit undesirable current flow between the sources. The arrangement in U.S. Pat. No. 5,808,378 avoids undesirable current flow between sources by delaying transfer until a polarity comparison is satisfied that ensures that the current will flow in the incoming source after transfer will be in opposition to the current flowing in the outgoing source before transfer. Undesirable transfer delays are also minimized by establishing a forced commutation condition before transfer between sources, i.e. transfer is delayed until the incoming source voltage differential and the outgoing current establish an initial change in current flow in opposition to current flow in the switch to be turned off.

SUMMARY OF THE INVENTION

Accordingly, it is a principal object of the present invention to provide a control arrangement and method for high-speed source-transfer switching systems that provides open-transition transfers to avoid the paralleling of sources and undesirable current flow.

It is another object of the present invention to provide a control arrangement and method for high-speed source-transfer switching systems that minimizes undesirable transfer delays by establishing appropriate conditions before performing the transfer between sources.

It is a further object of the present invention to provide a control arrangement for solid-state transfer switches that inhibits the transfer of a load from one source to another if the transfer condition is initiated by a downstream fault.

It is yet another object of the present invention to provide a control arrangement for high-speed source-transfer switching systems that both avoids undesirable current flow between sources via either the establishing of forced commutation conditions or by waiting before issuing control signals to perform the transfer between sources.

These and other objects of the present invention are efficiently achieved by the provision of a control arrangement and method for a power electronic system configured as a high-speed source-transfer switching system (HSSTSS). The HSSTSS supplies an electrical load with alternating current from either a first source or a second source via respective first and second solid-state switches. The HSSTSS also includes a controller that samples the voltage waveforms of each of the first and second sources to detect when transfer between the sources is desirable, e.g. outages or voltage that is either too low or too high. The controller provides appropriate control signals to control operation of the solid-state switches and transfer supply of the load therebetween. The control arrangement avoids undesirable current flow between sources via a comparison of the voltages of the sources and current in the outgoing source, i.e. a polarity comparison to ensure that the current that will flow in the incoming source after transfer will be in opposition to the current flowing in the outgoing source before transfer. Thus, the transfer is delayed until the polarity comparison is satisfied. Additionally, the control arrangement minimizes undesirable transfer delays by establishing appropriate transfer conditions before issuing control signals to perform the transfer between sources, i.e. the transfer to turn on the incoming switch is delayed until after appropriate conditions establish that the outgoing source is off or can be effectively turned off. One form of appropriate conditions include the establishing of forced commutation conditions, preferably established by the incoming source voltage differential and the outgoing current being of the same polarity such that the voltage differential across the solid-state switch that is being turned on is sufficient to establish an initial change in current flow in opposition to the current flow in the solid-state switch to be turned off. The appropriate forced commutation is established by the voltage differential between the two sources being of sufficient magnitude to force the outgoing current to zero. Additionally, under certain conditions, the transfer is accomplished by awaiting the next current zero.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
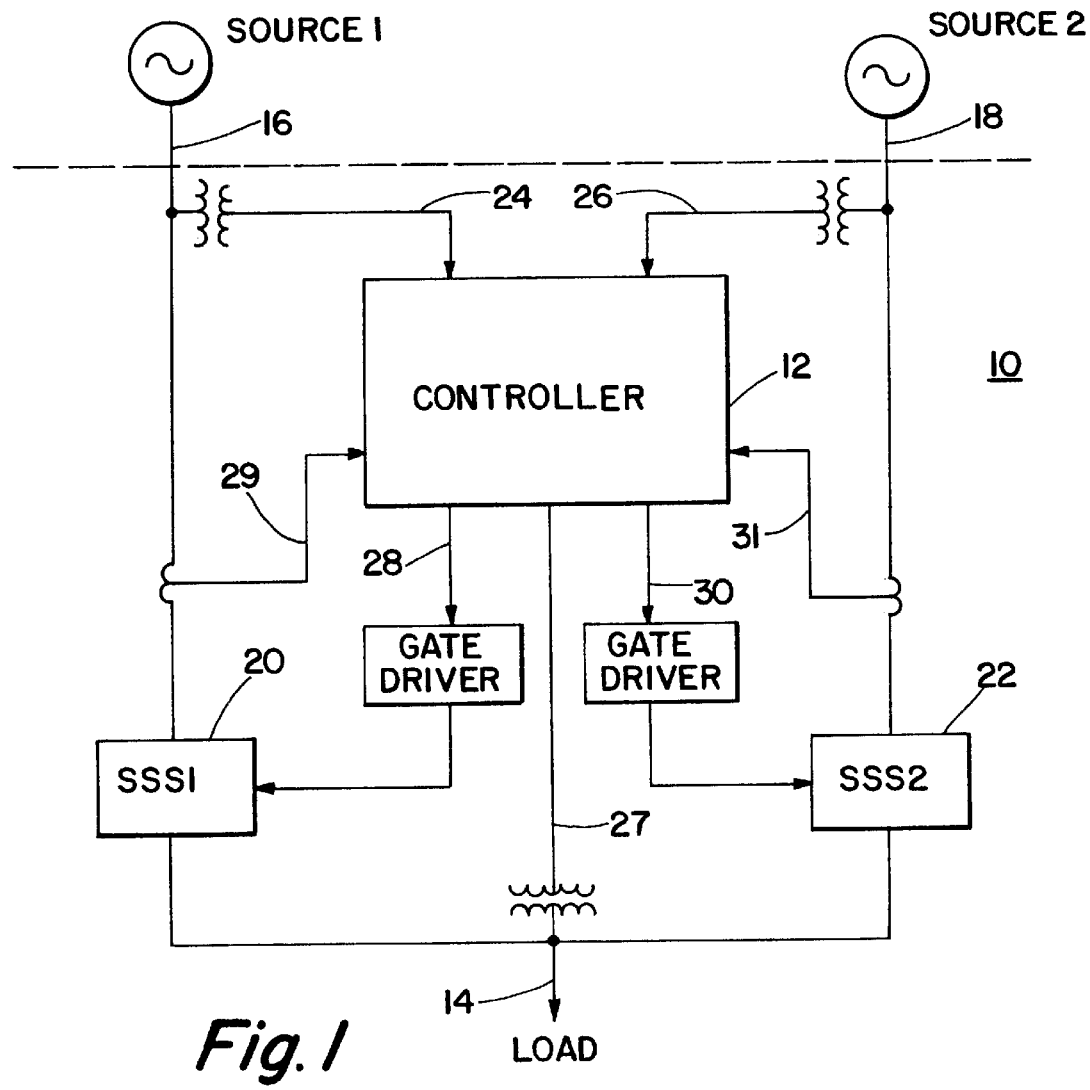
FIG. 1 is a one-line, block diagram representation of a power electronic system configured as a high-speed source-transfer switching system utilizing the control arrangement of the present invention.

Referring now to FIG. 1, a high-speed source-transfer switching system (HSSTSS) 10 includes a controller stage 12 to provide an illustrative embodiment of the control arrangement and method of the present invention. The HSSTSS 10 supplies a load at 14 with an alternating-current waveform via either a first AC source at 16 or a second AC source at 18. The first and second AC sources 16 and 18 and the load at 14 as provided in an electrical power distribution system are typically multi-phase circuits which are represented in FIG. 1 by a one-line diagram. The HSSTSS 10 includes a first solid-state switch, SSS1, 20 and a second solid-state switch, SSS2, 22. The HSSTSS 10 via the controller stage 12 controls either SSS1 to supply the load at 14 via the first source 16 or controls SSS2 to supply the load at 14 via the second source 18. The solid-state switches SSS1 and SSS2 may also be referred to as power electronic switches.

The controller stage 12 samples the voltage waveforms of each source 16, 18, e.g. via respective sensing inputs at 24, 26 to detect when transfer between the sources is desirable, e.g. sensing outages and momentary interruptions as well as voltage sags and swells based on the source supplying the load being above or below preset levels. The controller stage 12 provides appropriate control signals at 28, 30 to control the operation of each respective solid-state switch, SSS1 20 and SSS2 22. For example, assume that SSS1 20 is turned on by the controller stage 12 via signals at 28 so as to be conductive and supply the load at 14. If the controller stage 12 via the sensing input 24 senses that the voltage of the first source at 16 is exhibiting undesirable characteristics, the controller stage 12 via the control signals at 28, 30 turns off SSS1 and turns on SSS2 so as to transfer the supply of the load at 14 from the first source at 16 to the second source at 18. As used herein, the term "incoming" is used to describe the source and the SSS that will be turned on to supply the load (e.g. the second source at 18 and SSS2 in the illustrative example), and the term "outgoing" is used to describe the source and the SSS that is being turned off (e.g. the first source at 16 and SSS1 in the illustrative example).

Figure 2:
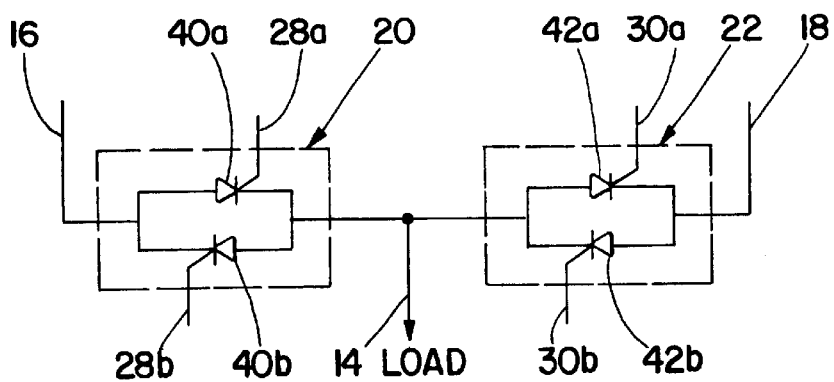
FIG. 2 is a one-line, diagrammatic representation of portions of a solid-state switch of FIG. 1.

Referring now to FIG. 2, each of the solid-state switches SSS1 and SSS2 includes one or more arrays of back-to-back connected thyristors, e.g. 40a and 40b for SSS1 and 42a and 42b for SSS2. In illustrative implementations, each array of thyristors is rated in the range of 2–10 kv. To provide operation in medium voltage systems, e.g. operating in the range of 2–34.5 kv, one or more of such thyristors SSS1 and SSS2 are connected in series for each phase of the sources, e.g. a plurality of such thyristors being referred to as a stack. Thus, while the term thyristor is used for the solid-state switches SSS1, 40 and SSS2, 42, this commonly refers to a thyristor stack.

Considering now operation of the control arrangement and method of the present invention, transfer of the load at 14 from one source to the other, e.g. the first source at 16 to the second source at 18, is generally accomplished by removing the gating signals at 28a, 28b to shut off SSS1 and starting the gating signals at 30a, 30b to turn on SSS2. Thus, the first source at 16 ceases to supply the load at 14 and the second source at 18 begins to supply the load at 14. This general approach can encounter problems especially when the transfer is initiated due to an upstream fault on the outgoing source, e.g. the first source at 16 in the illustration. For example, because power system loads generally are not of unity power factor, there are times when the current between the source and the load flows in opposition to the source voltage, i.e. the polarity of the voltage and current are different. If a fault and the initiation of a transfer occur when the current and voltage are of the same polarity, i.e. the current flows into the load (defined as positive) and the source voltage (relative to ground) is also positive, the cessation of gate signals to SSS1 quickly followed by the application of gate signals to SSS2 results in a desirable transfer referred to as forced commutation since the current from SSS2 opposes the current flowing in SSS1, rapidly driving the current in SSS1 to zero. However, if the load current and the first source voltage at 16 are of opposite polarity at the time transfer is initiated, e.g. if the source voltage at 16 is positive and the load current is negative, when the gating signals from SSS1 are removed, the thyristor 40b will continue to conduct until the occurrence of a current zero. If SSS2 receives gating signals before the current zero in SSS1, the second source at 18 can supply current but this current flow will not be in opposition to the current in SSS1 which results in a condition referred to as a shoot-through via the thyristors 42b and 40b. If the first source at 16 has a fault condition, the second source at 18 would begin to feed this fault condition which, of course, is very undesirable. Thus the present invention is arranged to provide open-transition transfers and not closed-forward transfers.

In accordance with important aspects of the present invention, the controller 12 is capable of performing the transfer and the application of the appropriate gating signals based on the establishing of forced commutation conditions including a polarity comparison between the outgoing current and the differential voltage between the first and second sources at 16, 18, e.g. by delaying the application of the gate signals to the incoming thyristor 42b in the illustrative example until appropriate conditions are established. Specifically, the source-voltage differential (i.e. difference), the voltage across the incoming SSS, is used to define a positive indication of the initial current which will flow through the incoming SSS. If the initial current which will flow through the incoming SSS opposes the current in the outgoing source, forced commutation will occur and no delay of the application of the gate signals to the incoming SSS2 is necessary. On the other hand, if the initial current which will flow through the incoming SSS supports the current in the outgoing source, a shoot-through would occur, and a delay of the application of the gate signals to the thyristor 42b is performed, i.e. until the polarity comparison is satisfied. The incoming source-voltage differential may be determined by the load voltage at 14 as sensed via a sensing input 27 or by the differential of the source voltages sensed at 24, 26. Additionally, the controller 12 is capable of performing a transfer via awaiting until other appropriate transfer conditions are established, e.g. current zero conditions or other conditions establishing that the outgoing switch is nonconducting.

Figure 3:
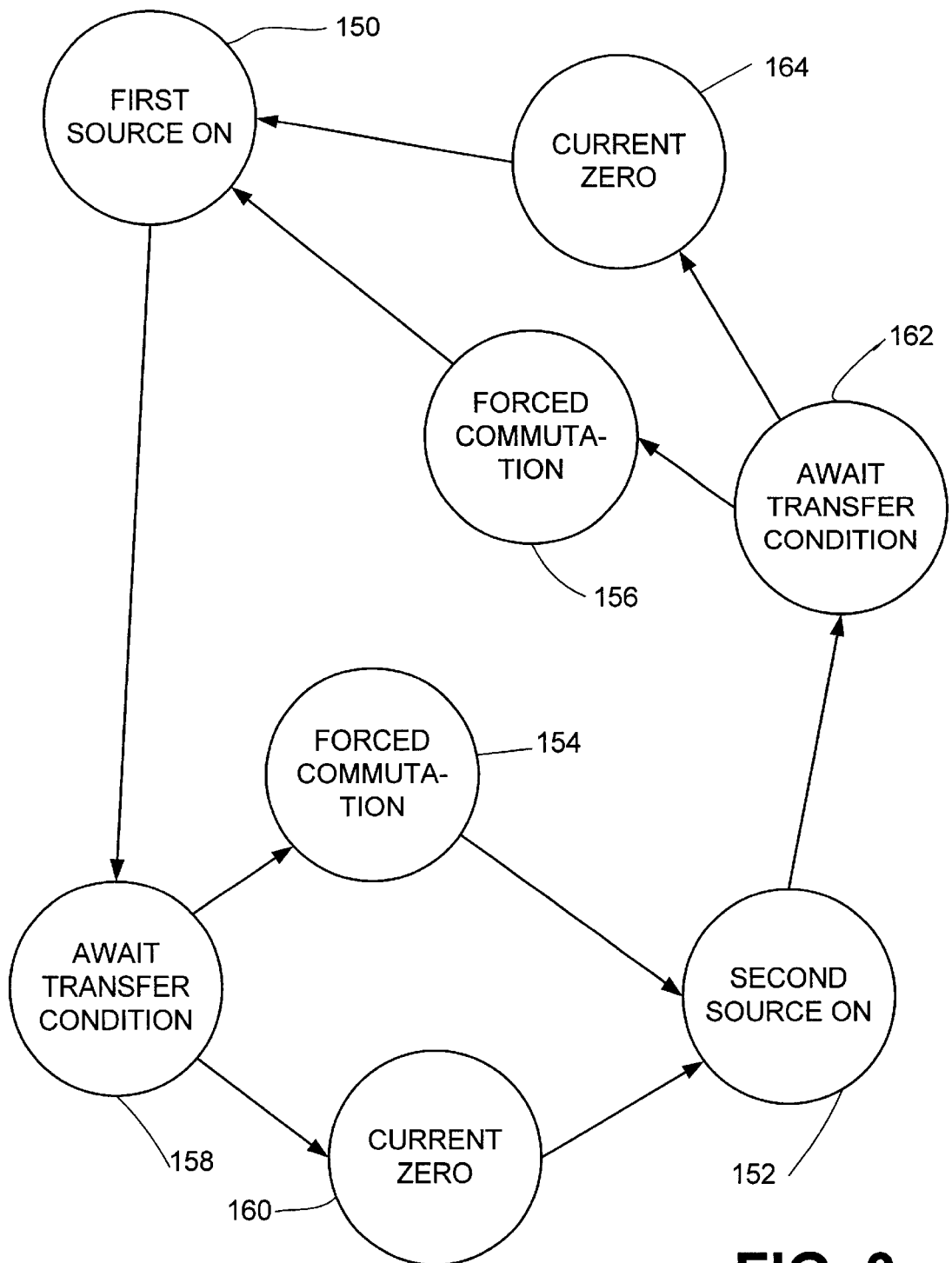
FIG. 3 is a state diagram representation of a high-speed source-transfer switching system illustrating a specific control arrangement of the present invention.

Considering now additional important aspects of the present invention and referring now additionally to FIG. 3, the depicted state diagram illustrates a specific implementation of the control of the high-speed source-transfer switching system to transfer between sources. Each phase of each source traverses the state diagram of FIG. 3 independently. A "First Source On" state 150 depicts the condition of the system when the first source 16 is supplying the load at 14 and a "Second Source On" state 152 depicts the condition of the system when the second source 18 is supplying the load at 14. Any decision to leave the states 150 or 152 is based on any phase of the source being found to be unsuitable and the decision is then made for all phases of that source, assuming that the other available sources are determined to be of better quality than the present source.

For example, in an illustrative embodiment, if the controller 12 determines that an undesirable sag or swell is present on at least one phase of the first source 16, after the second source 18 is verified to be of better quality, a transfer to the second source is begun with a transition to an "Await Transfer Conditions" state 158 along with the switch SSS1, 20 being turned off via the removal of the gating signals at 28. In a specific arrangement, for predetermined sag conditions, the controller 12 also verifies that there is no downstream fault before a transfer decision is made. Transition is then made in parallel to both a "Forced Commutation" state 154 and a "Current Zero" state 160. If the forced commutation conditions are satisfied within the state 154, a transition is made to the "Second Source On" state 152 via the applying of gate signals to the incoming switch SSS2, 22. If the conditions are not met within the "Forced Commutation" state 154, a transfer to the "Second Source On" state 152 is performed when the conditions in a "Current Zero" state 160 are satisfied, e.g. by verifying that the switch SSS1 is non-conducting or by determining a current zero condition. In accordance with a preferred embodiment, when transfer is desired, transfer is initiated via both transition paths 158 to 154 to 152 and 158 to 160 to 152.

Thus, transfer is accomplished by whichever conditions are satisfied and occur first. In another embodiment, transfer for certain categories of disturbances is accomplished via the forced commutation conditions while transfer for other categories of disturbances is accomplished via the current zero conditions. In yet another embodiment, transfer for certain categories of disturbances is accomplished via either path via states 154 or 160 while transfer for other categories of disturbances is accomplished only via the forced commutation conditions in the state 154. Subsequently, if the controller 12 determines that an unsuitable sag or swell is present on the second source 18, after the first source 16 is verified to be suitable, a transfer to the first source 16 is begun with a transition to an "Await Transfer Conditions" state 162" and then in parallel to both a "Forced Commutation" state 156 and a "Current Zero" state 164. If the forced commutation conditions are satisfied within the state 156, a transition is made to the "First Source On" state 150 via the applying of gate signals to the incoming switch SSS1, 20. If the conditions are not met within the "Forced Commutation" state 156, a transfer to the "First Source On" state 150 is performed when the conditions in the "Current Zero" state 164 are satisfied.

Figure 4:
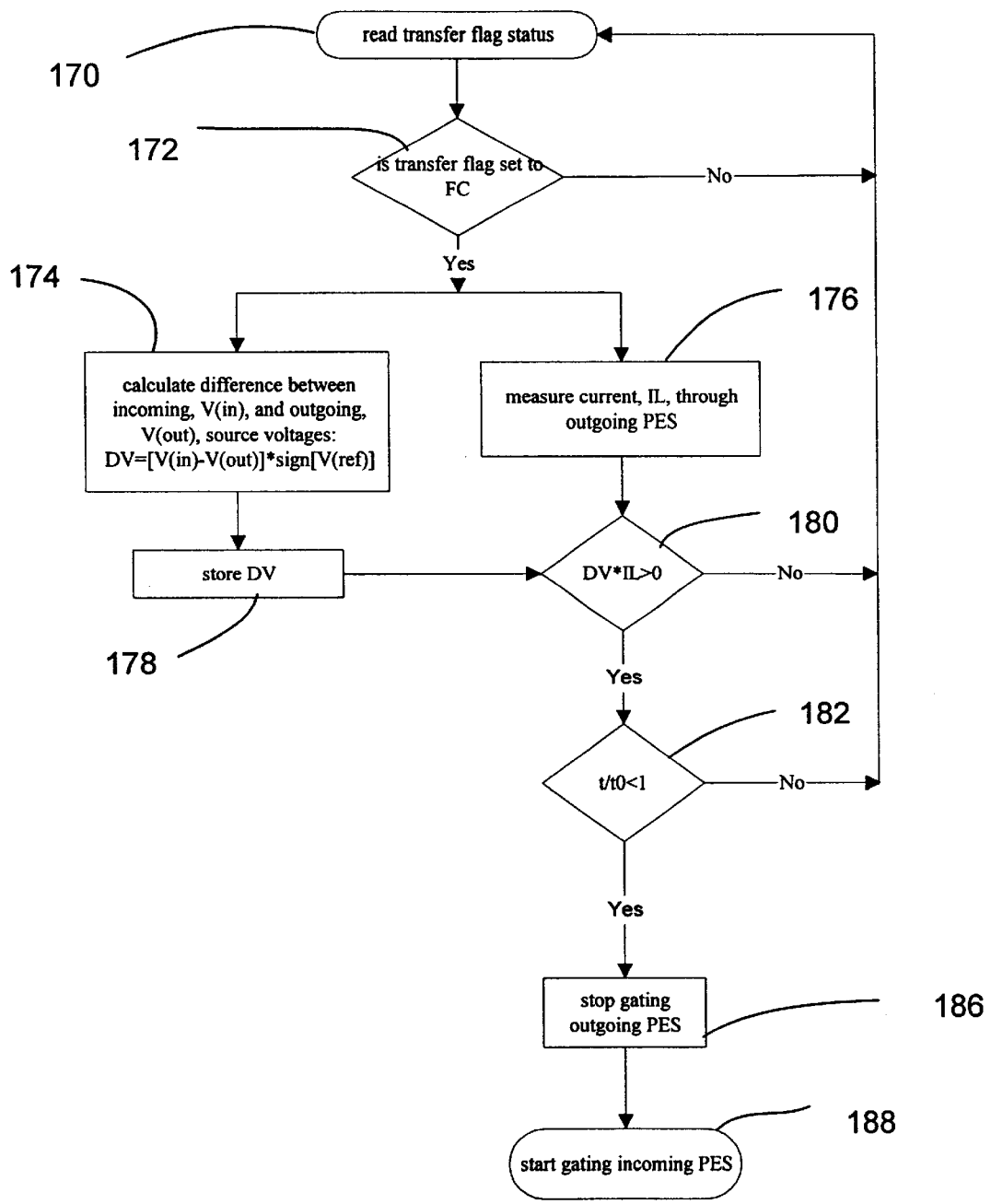
FIGS. 4 and 5 are flow diagrams illustrating portions of the control arrangement of FIG. 1.

Referring now additionally to FIG. 4, the flow diagram depicts an implementation of the forced commutation conditions to be established in the states 154 and 156 of FIG. 3. In accordance with important aspects of the present invention, the forced commutation conditions of the flow diagram of FIG. 4 utilize the polarity of the sources, the direction of current flow, and a determination that the voltage differential between sources is sufficient to force the load current to zero in a suitable time frame corresponding to the point on the existing waveform. These forced commutation conditions are utilized in response to a detected severe sag condition, e.g. caused by a fault condition, before a transfer is made between sources. The forced commutation conditions are required and/or desirable for the more severe sag and swell conditions because it is not desirable to wait for a current zero nor can the current zero necessarily be accurately predicted in some of these situations, e.g. severe sags.

For the establishment of the conditions in the "Current Zero" states 160 and 164 (FIG. 3), one implementation establishes that the outgoing switch is off via the voltage across the outgoing switch, e.g. the outgoing voltage minus the load voltage being greater than 3% of the nominal peak voltage over a suitable time period or number of samples thus establishing that the outgoing switch is off. However, it should be understood that lower voltages, e.g. in excess of 100 volts should suffice. The current zero conditions of states 160 and 164 are especially useful for the less severe categories of disturbance conditions because forced commutation conditions are not necessarily required and can not always be satisfied in the presence of such conditions.

In FIG. 4, process flow begins in a block 170 which responds to a request for transfer. The process flow (in one specific embodiment) then proceeds to a determination block 172 to determine if the transfer request applies to forced commutation conditions, and if so, the process flow proceeds in parallel to two process blocks 174 and 176. If the transfer request does not apply, the process flow returns to the block 170. The process block 174 calculates source differentials and a parameter denoted "DV" which corresponds to the voltage differential between the sources multiplied by the sign of the reference voltage. This parameter DV is stored in a process block 178. The process block 176 calculates the load current IL through the outgoing switch and supplies this to a determination block 180, which also receives as an input the stored DV parameter. The block 180 determines whether the product of these two inputs is greater than zero, and if so, the process flow proceeds to another determination block 182. If the product is not greater than zero, the process flow returns to the block 170. The determination block 182 determines whether the ratio of "t" (the time to perform a transfer) to the time "$t_o$" (the time remaining before the next voltage zero) is less than 1 so as to establish that a transfer is possible. If the result is less than 1, the process flow proceeds to a process block 186 to stop the gating of the outgoing switch (for specific embodiments where the gating has not already been removed from the outgoing switch at the time a transfer decision is made). The process flow then proceeds to a termination block 188 to start the incoming switch gating to turn on the incoming switch. If the determinations in the block 182 is no, the process flow returns to the block 170.

This flow process can be summarized as performing the following relationship of conditions:

$$\frac{t}{t_0} < 1, \text{ i.e. when} \frac{\frac{L\ i}{L_0\ i_0}}{\frac{V}{V_0}} < 1,$$

where:

$V_0$: the maximum, steady-state voltage difference between the reference voltage and the sag level 5 voltage $i_0$: the peak current flowing into the load. Note that it is not the rated current $t_0$: based on the point on wave at which the transfer request is made, the time remaining before the reference voltage next goes through a zero $L_0$: total source inductance, e.g. approximately 0.6 mH and the properties of the system are:

V: the instantaneous difference between the incoming and outgoing voltages i: the instantaneous value of the load current t: the time required to make a transfer. This value is actually calculated, since we know that if the dimensionless time (t/t0) exceeds one, then a loop current will result L: the value of the line inductance between the outgoing switch and the nearest significant voltage source. Where there are large lumped capacitors on the system, this will be the inductance up to the nearest bank, but where there are none, then it will be the short circuit inductance of the line.

Of course, the value of $L_0$ can be varied depending on system properties.

In accordance with a specific embodiment based on the foregoing parameters to provide a practical generalized approach to a correlation equation derived from commutation data and adjusted to provide a conservative approach to ensure proper commutation, the following relationship is utilized for the process block 182:

$$\Delta V = p \cdot i^q,$$

where p=26.5 and q=1.75.

This approach, being conservative, delays transfers which might be feasible in borderline conditions such that transfer will occur when the correlating equation is later satisfied, e.g. with a delay probably less than 3 milliseconds.

In accordance with additional aspects of the present invention to provide a more conservative approach to establish that the forced commutation conditions will be satisfied for possible borderline conditions and severe operating environments, a minimum voltage criterion is also utilized to ensure that the outgoing switch will remain off after the incoming switch is turned on. For example, a voltage in the range of 3% of the nominal peak voltage over a suitable time period or number of samples thus establishing that the outgoing switch is off, although it should be understood that lower voltages, e.g. in excess of 100 volts, should suffice.

Figure 5:
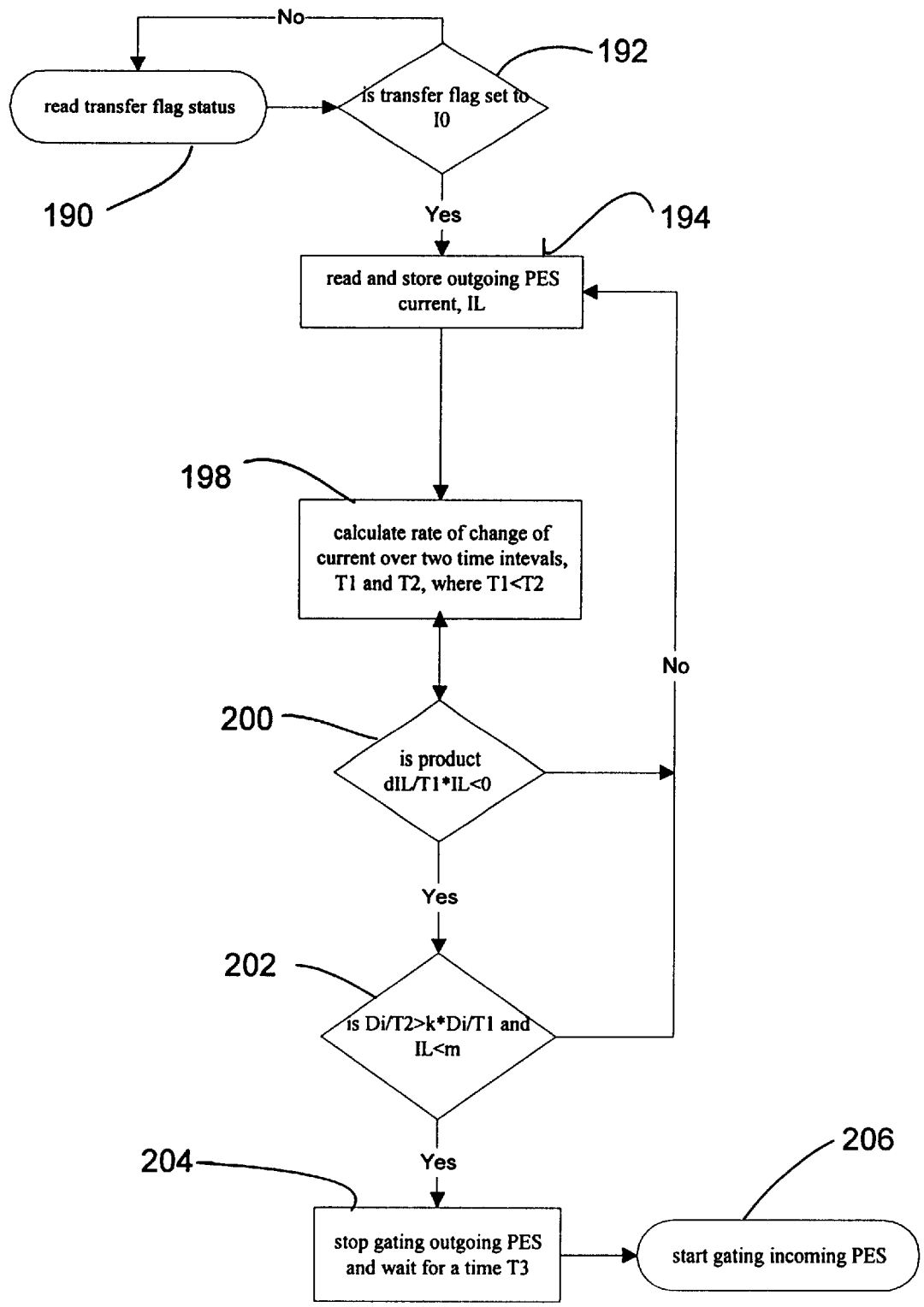

Referring now to FIG. 5 and in accordance with other important aspects of the present invention relating to an illustrative alternate embodiment to establish the transfer conditions of the "Current Zero" states 160 and 164, the process begins at a block 190 to respond to a request for transfer. If there is a request for transfer, the process flow proceeds to a determination block 192 to determine if the transfer request applies to the current zero conditions. If so, the process flow proceeds through two process blocks 194 and 198 and a determination block 200 to calculate the necessary parameters to evaluate if the rate of change in current is less than zero in the block 200. If the rate of change is satisfied, the process flow proceeds to a determination block 202 to determine if a current zero is predicted. If a current zero is predicted, the process flow proceeds to a process block 204 to stop the gating of the outgoing switch (if not already accomplished) and start a delay timing interval. The process flow then proceeds to a termination block 206 to start the gating of the incoming switch. If the result in either of the determination blocks 200 or 202 is not established, the process flow returns to the process block 194. In blocks 198, 200 and 202, T2/T1 is in the range of 2–5, with T1 in a specific implementation being about 0.5 milliseconds, k is approximately 50% in a specific implementation, IL is an instantaneous overcurrent threshold, and m is a maximum current level for the current zero prediction to be valid, e.g. 0.16 per unit with a rate of change dependency in a specific implementation, Di is the slope of the current.

Figure 6:
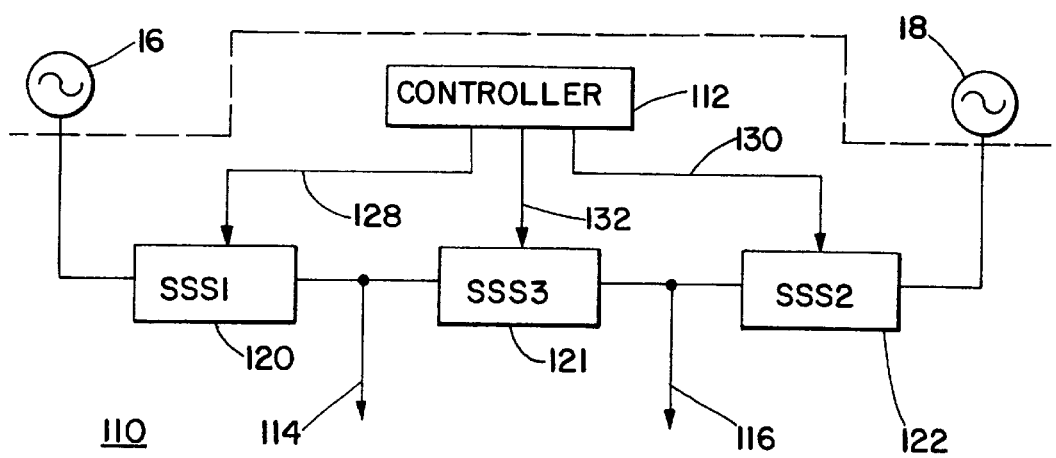
FIG. 6 is a one-line, block diagram representation of another circuit configuration different than FIG. 1.

Referring now additionally to FIG. 6 and considering another illustrative source transfer switching system 110 where more than two solid-state switches are controlled, a controller 112 of a high-speed source-transfer switching system (HSSTSS) 110 controls solid-state switches SSS1, 120, SSS2, 122 and SSS3 121 via respective control signal paths 128, 130, and 132. The specific illustrative circuit configuration of FIG. 6 implements a split-bus primary selective system, which is used to split the load during normal operation. Specifically, in normal operation, a first source 16 supplies a first load circuit 114 via SSS1 and a second source 18 supplies a second load circuit 116 via SSS2, with SSS3 normally being turned off (nonconducting) and functioning as a bus-tie switch. Thus, each of the sources 16, 18 is a preferred source for its respective load circuit 114, 116 and each is an alternate source for the other load circuit, 116, 114 respectively. When one of the sources at 16, 18 is lost or exhibits undesirable characteristics, the controller 112, after a transfer decision is made, and as described hereinbefore, removes the signals at 128 or 130 and applies signals at 132 such that the load circuits 114, 116 are supplied from one of the sources at 16 or 18. For example, if the source 16 is lost, SSS1, 120 will be turned off and SSS3, 121, the bus-tie switch, will be turned on to supply the load circuit 114 while SSS2, 122 continues to supply the load circuit 116. The polarity comparison to establish the appropriate application of control signals in the circuit configuration of FIG. 6 utilizes the differential voltage across the incoming switch, e.g. SSS3, 121 when transferring the load circuit 114 so as to be supplied from the source 18 via SSS3, 121 and SSS2, 122. Similarly, upon the return of the source 16, when the normal configuration is to be restored, the differential voltage across the incoming switch, e.g. SSS1, 120 is utilized for the polarity comparison.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed is:

1. A control arrangement for a source-transfer switching system of the type that includes first and second solid-state switches having respective first and second control inputs, input source connections and output connections, the output connections connected to a common load circuit connection, the control arrangement comprising:

transfer control means for controlling the first and second solid-state switches via the first and second control inputs so as to selectively supply the common load circuit connection via either the first or second solid-state switch, said transfer control means further comprising first means for selectively transferring control between the first and second solid-state switches when the incoming voltage differential across the solid-state switch to be turned on is sufficient to establish an initial current flow that is in opposition to the current flow in the solid-state switch to be turned off, and second means for selectively transferring control whenever it is possible to establish that the switch to be turned off will remain off.

2. The control arrangement of claim 1 wherein said first means comprises means for determining if there is sufficient time for the initial current flow to drive the current in the solid-state switch to be turned off to zero.

3. The control arrangement of claim 2 wherein the input source connections are connected to alternating-current sources.

4. The control arrangement of claim 2 wherein said first means further comprises means responsive to the inductance defined by the source.

5. The control arrangement of claim 1 wherein said first means further comprises third means responsive to a first transfer input for transferring control based on said incoming voltage differential.

6. The control arrangement of claim 1 wherein said second means comprises third means for measuring the voltage across the switch to be turned off.

7. The control arrangement of claim 1 wherein said second means comprises third means for predicting the occurrence of a current zero.

8. A method for controlling a source-transfer switching system of the type that includes first and second solid-state switches having respective first and second control inputs, input source connections and output connections, the output connections being connected to a common load circuit connection, the method comprising the steps of:

controlling the first and second solid-state switches via the first and second control inputs so as to selectively supply the common load circuit connection via either the first or second solid-state switch;

detecting predetermined conditions so as to make transfer between the first and second solid-state switches desirable;

transferring control between the first and second solid-state switches in response to a first category of predetermined conditions detected in said detecting step based on the incoming voltage differential across the solid-state switch to be turned on being sufficient to establish an initial current flow that is in opposition to the current flow in the solid-state switch to be turned off; and transferring control between the first and second solid-state switches in response to a second category of predetermined conditions detected in said detecting step based on the input source connection to the solid-state switch to be turned off.

9. A method for controlling the transition from supplying a load from one switch to another switch, each of the switches including input and output connections, each input connected to a respective source connection, the method comprising the step of determining when appropriate conditions will be satisfied to perform the transfer as an open transition without paralleling the sources supplying the switches, said determining step further comprising the step of establishing when forced commutation conditions are met or establishing when the switch to be turned off will remain off when the switch to be turned on is turned on.

* * * * *